(12) United States Patent
Ziglioli

(10) Patent No.: US 10,861,760 B2
(45) Date of Patent: Dec. 8, 2020

(54) METHOD OF MANUFACTURING SEMICONDUCTOR DEVICES AND CORRESPONDING SEMICONDUCTOR DEVICE

(71) Applicant: STMICROELECTRONICS S.R.L., Agrate Brianza (IT)

(72) Inventor: Federico Giovanni Ziglioli, Pozzo d'Adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/551,272

(22) Filed: Aug. 26, 2019

(65) Prior Publication Data

US 2019/0378774 A1 Dec. 12, 2019

Related U.S. Application Data

(62) Division of application No. 15/987,102, filed on May 23, 2018, now Pat. No. 10,424,525.

(30) Foreign Application Priority Data

May 23, 2017 (IT) .................. 102017000055983

(51) Int. Cl.
*H01L 23/31* (2006.01)
*H01L 21/3105* (2006.01)
(Continued)

(52) U.S. Cl.
CPC ........ *H01L 23/3114* (2013.01); *H01L 21/288* (2013.01); *H01L 21/31058* (2013.01);
(Continued)

(58) Field of Classification Search
CPC ............ H01L 23/3114; H01L 21/4882; H01L 21/561; H01L 21/78; H01L 24/16;
(Continued)

(56) References Cited

U.S. PATENT DOCUMENTS 5,074,947 A 12/1991 Estes et al.
5,237,130 A 8/1993 Kulesza et al.
(Continued)

FOREIGN PATENT DOCUMENTS

CN 101930958 A 12/2010
DE 69027125 T2 11/1996
(Continued)

OTHER PUBLICATIONS

Boettcher et al., "Embedding of Chips for System in Package realization—Technology and Applications," $3^{rd}$ *International Microsystems, Packaging, Assembly & Circuits Technology Conference*, Taipei, Taiwan, Oct. 22-24, 2008, pp. 383-386. (7 pages).

*Primary Examiner* — Dung A. Le
(74) *Attorney, Agent, or Firm* — Seed Intellectual Property Law Group LLP

(57) ABSTRACT

An assembly is provided including one or more semiconductor dice attached on a substrate, the semiconductor die provided with electrically-conductive stud bumps opposite the substrate. The stud bumps embedded in a molding compound molded thereon are exposed to grinding thus leveling the molding compound to expose the distal ends of the stud bumps at a surface of the molding compound. Recessed electrically-conductive lines extending over said surface of the molding compound with electrically-conductive lands over the distal ends of the stud bumps. A further molding compound is provided to cover the recessed electrically-conductive lines and surrounding the electrically-conductive lands.

17 Claims, 10 Drawing Sheets

(51) Int. Cl.

| | | |
|---|---|---|
| H01L 21/768 | (2006.01) | |
| H01L 21/56 | (2006.01) | |
| H01L 21/683 | (2006.01) | |
| H01L 21/288 | (2006.01) | |
| H01L 23/367 | (2006.01) | |
| H01L 23/16 | (2006.01) | |
| H01L 23/538 | (2006.01) | |
| H01L 23/00 | (2006.01) | |
| H01L 21/78 | (2006.01) | |
| H01L 21/48 | (2006.01) | |

(52) U.S. Cl.
CPC ........ *H01L 21/4882* (2013.01); *H01L 21/561* (2013.01); *H01L 21/565* (2013.01); *H01L 21/568* (2013.01); *H01L 21/6836* (2013.01); *H01L 21/76802* (2013.01); *H01L 21/76879* (2013.01); *H01L 21/78* (2013.01); *H01L 23/16* (2013.01); *H01L 23/3121* (2013.01); *H01L 23/367* (2013.01); *H01L 23/5386* (2013.01); *H01L 23/5389* (2013.01); *H01L 24/16* (2013.01); *H01L 24/19* (2013.01); *H01L 24/97* (2013.01); *H01L 24/48* (2013.01); *H01L 24/73* (2013.01); *H01L 2221/68359* (2013.01); *H01L 2224/04105* (2013.01); *H01L 2224/16227* (2013.01); *H01L 2224/214* (2013.01); *H01L 2224/32145* (2013.01); *H01L 2224/32225* (2013.01); *H01L 2224/32245* (2013.01); *H01L 2224/48091* (2013.01); *H01L 2224/48101* (2013.01); *H01L 2224/48106* (2013.01); *H01L 2224/48137* (2013.01); *H01L 2224/48145* (2013.01); *H01L 2224/48464* (2013.01); *H01L 2224/73207* (2013.01); *H01L 2224/73227* (2013.01); *H01L 2224/73265* (2013.01); *H01L 2224/73267* (2013.01); *H01L 2224/92244* (2013.01); *H01L 2924/18162* (2013.01)

(58) Field of Classification Search
CPC ... H01L 23/5386; H01L 23/16; H01L 23/367; H01L 21/288; H01L 21/6836; H01L 21/568; H01L 21/76802; H01L 21/76879; H01L 21/31058; H01L 21/565; H01L 2224/48464

See application file for complete search history.

(56) References Cited

U.S. PATENT DOCUMENTS

| | | | |
|---|---|---|---|
| 5,879,761 A | 3/1999 | Kulesza et al. | |
| 6,064,217 A | 5/2000 | Smith | |
| 6,498,099 B1 | 12/2002 | McLellan et al. | |
| 7,262,082 B1 | 8/2007 | Lin et al. | |
| 7,268,421 B1 | 9/2007 | Lin | |
| 7,291,380 B2 | 11/2007 | Nyholm et al. | |
| 7,446,419 B1 | 11/2008 | Lin et al. | |
| 7,632,753 B1 | 12/2009 | Rusli et al. | |
| 7,820,480 B2 | 10/2010 | Islam et al. | |
| 7,919,406 B2 | 4/2011 | Tseng et al. | |
| 8,232,141 B2 | 7/2012 | Choi et al. | |
| 8,482,111 B2 | 7/2013 | Haba | |
| 8,525,314 B2 | 9/2013 | Haba et al. | |
| 8,531,020 B2 | 9/2013 | Haba et al. | |
| 8,618,659 B2 | 12/2013 | Sato et al. | |
| 8,623,706 B2 | 1/2014 | Haba | |
| 8,637,991 B2 | 1/2014 | Haba | |
| 8,643,150 B1 | 2/2014 | Xu et al. | |
| 8,659,153 B2 | 2/2014 | Fay et al. | |
| 8,659,164 B2 | 2/2014 | Haba | |
| 8,728,865 B2 | 5/2014 | Haba et al. | |
| 8,829,676 B2 | 9/2014 | Yu et al. | |
| 8,835,228 B2 | 9/2014 | Mohammed | |
| 8,836,136 B2 | 9/2014 | Chau et al. | |
| 8,841,779 B2 | 9/2014 | Pendse | |
| 8,878,353 B2 | 11/2014 | Haba et al. | |
| 8,883,563 B1 | 11/2014 | Haba et al. | |
| 8,907,466 B2 | 12/2014 | Haba | |
| 8,927,337 B2 | 1/2015 | Haba et al. | |
| 8,957,527 B2 | 2/2015 | Haba | |
| 8,975,738 B2 | 3/2015 | Haba et al. | |
| 9,023,691 B2 | 5/2015 | Mohammed et al. | |
| 9,034,696 B2 | 5/2015 | Mohammed et al. | |
| 9,041,227 B2 | 5/2015 | Chau et al. | |
| 9,082,753 B2 | 7/2015 | Haba et al. | |
| 9,087,732 B1 | 7/2015 | Xu et al. | |
| 9,087,815 B2 | 7/2015 | Haba et al. | |
| 9,093,435 B2 | 7/2015 | Sato et al. | |
| 9,095,074 B2 | 7/2015 | Haba et al. | |
| 9,105,483 B2 | 8/2015 | Chau et al. | |
| 9,123,664 B2 | 9/2015 | Haba | |
| 9,153,562 B2 | 10/2015 | Haba et al. | |
| 9,214,454 B2 | 12/2015 | Haba et al. | |
| 9,218,988 B2 | 12/2015 | Haba et al. | |
| 9,224,717 B2 | 12/2015 | Sato et al. | |
| 9,230,902 B2 | 1/2016 | Yu et al. | |
| 9,252,122 B2 | 2/2016 | Chau et al. | |
| 9,263,412 B2 | 2/2016 | Lin et al. | |
| 9,269,687 B2 | 2/2016 | Chen et al. | |
| 9,324,681 B2 | 4/2016 | Haba et al. | |
| 9,349,706 B2 | 5/2016 | Co et al. | |
| 9,356,006 B2 | 5/2016 | Haba et al. | |
| 9,368,460 B2 | 6/2016 | Yu et al. | |
| 9,391,008 B2 | 7/2016 | Mohammed | |
| 9,412,714 B2 | 8/2016 | Co et al. | |
| 9,443,789 B2 | 9/2016 | Weatherspoon et al. | |
| 9,502,390 B2 | 11/2016 | Caskey et al. | |
| 2002/0056741 A1 | 5/2002 | Shieh et al. | |
| 2002/0074672 A1 | 6/2002 | Huang et al. | |
| 2003/0094693 A1 | 5/2003 | Fang | |
| 2004/0130034 A1 | 7/2004 | Alvarez | |
| 2004/0154163 A1 | 8/2004 | Miyazaki et al. | |
| 2004/0198022 A1 | 10/2004 | Alvarez | |
| 2004/0238945 A1 | 12/2004 | Huang et al. | |
| 2005/0032272 A1 | 2/2005 | Prather et al. | |
| 2007/0158837 A1 | 7/2007 | Kurita et al. | |
| 2009/0072394 A1* | 3/2009 | Onodera | H01L 21/6835 257/737 |
| 2009/0236726 A1 | 9/2009 | Retuta et al. | |
| 2012/0261818 A1 | 10/2012 | Pagaila et al. | |
| 2013/0075936 A1 | 3/2013 | Lin et al. | |
| 2013/0095610 A1 | 4/2013 | Chau et al. | |
| 2013/0105972 A1 | 5/2013 | Tam et al. | |
| 2013/0154076 A1 | 6/2013 | Camacho et al. | |
| 2013/0161817 A1 | 6/2013 | Khandekar et al. | |
| 2014/0120263 A1 | 5/2014 | Yee et al. | |
| 2015/0076714 A1 | 3/2015 | Haba et al. | |
| 2015/0279778 A1* | 10/2015 | Camacho | H01L 21/56 257/737 |
| 2016/0118272 A1 | 4/2016 | Yu et al. | |
| 2017/0094801 A1 | 3/2017 | Choi et al. | |

FOREIGN PATENT DOCUMENTS

| | | |
|---|---|---|
| DE | 69033817 T2 | 6/2002 |
| EP | 0506859 B1 | 5/1996 |
| EP | 1089331 A2 | 4/2001 |
| EP | 0690490 B1 | 10/2001 |
| WO | 91/09419 A1 | 6/1991 |
| WO | 2005084163 A2 | 9/2005 |
| WO | 2015038250 A1 | 3/2015 |
| WO | 2015039043 A2 | 3/2015 |

\* cited by examiner

METHOD OF MANUFACTURING SEMICONDUCTOR DEVICES AND CORRESPONDING SEMICONDUCTOR DEVICE

BACKGROUND

Technical Field

The description relates to semiconductor devices.

One or more embodiments may be applied to semiconductor devices or packages comprising integrated circuits, for instance of the Quad Flat No-Lead (QFN) type.

Description of the Related Art

Semiconductor devices and related processes are an area of extensive research as witnessed, e.g., by a high number of patent documents.

The following is a—purely exemplary and non-limiting—list of such documents:
  US 2005/0032272 A1, WO 2005/084163 A2 (related to creating flip-chip conductive polymer bumps using photolithography and polishing),
  DE 69027125 D1, DE 69033817 D1, EP 0506859 A1, EP 0690490 A2, EP 1089331 A2, U.S. Pat. Nos. 5,074,947 A, 5,237,130 A, WO 1991/009419 A1 (concerning flip-chip bonding methods using electrically-conductive polymer bumps),
  U.S. Pat. No. 6,064,217 B1 (which describes a fine-pitch contact device employing a compliant conductive polymer bump),
  U.S. Pat. No. 5,879,761 A (which describes forming electrically-conductive polymer interconnects on electrical substrates),
  US 2002/0074672 A1 (which describes a semiconductor package without a substrate and a method of manufacturing same),
  U.S. Pat. No. 8,841,779 B2 (which describes a semiconductor device and method of forming high routing density BOL (bump-on-lead), BONL (bump-on-narrow-lead) and BONP (bump-on-narrow-pad) interconnect sites on a substrate),
  U.S. Pat. No. 6,498,099 B1 (which describes a leadless plastic chip carrier with etch back pad singulation),
  U.S. Pat. No. 7,820,480 B2 (which describes lead frame routed chip pads for semiconductor packages),
  U.S. Pat. No. 9,443,789 B1, US 2015/0069621 A1, WO 2015/038250 A1 (which describe embedded electronic packaging and associated methods),
  U.S. Pat. No. 7,291,380 B2 (which describes laser-enhanced plating for forming wiring patterns), and
  US 2014/0120263 A1 (which describes a process for electroless plating and a solution used for the same).

The paper by L. Boettcher, et al.: "Embedding of Chips for System in Package realization—Technology and Applications", IMPACT, 2008 conference paper, November 2008 also provides some background for the discussion herein.

Various recognized problems in the area considered herein include the following:
  routed QFN arrangements may involve a complex and expensive substrate,
  flip-chip QFN structures may involve bumping, which is expensive,
  BOM (Bill Of Materials) specifications may involve parts from external suppliers.

BRIEF SUMMARY

One or more embodiments may relate to a semiconductor device or package and a corresponding circuit and methods for forming same.

The claims are an integral part of the technical teaching provided herein in respect of one or more embodiments.

In one or more embodiments, conductive stud bumps can be provided on a wafer or die after attaching on a temporary substrate.

In one or more embodiments, singulated dice with bumps can be attached to a chip substrate, e.g., in case of studs provided at wafer level.

In one or more embodiments, the dice on a a strip can be molded with an LDS (Laser Direct Structuring) compound by benefiting from the fact that a thermoplastic/thermoset polymer can be plated after laser activation.

In one or more embodiments, the strip can be subject to grinding after molding to expose and flattening stud bumps.

In one or more embodiments, laser grooves with different depths can be provided in an LDS compound in order to create routing traces (tracks) and lands around pads.

In one or more embodiments, plating can be performed in order to metallize selectively an LDS compound at laser activated areas thus creating routing traces and lands.

One or more embodiments may involve a secondary molding process in order to encapsulate the lands and cover the traces.

In one or more embodiments, a flash of gold can be applied on the lands.

In one or more embodiments, units can be singulated from a strip.

One or more embodiments may provide thinner and smaller packages with economic bumping and an economic substrate, e.g., within the framework of a process which may not involve intervention of external suppliers.

One or more such embodiments may benefit, e.g., from the capability of providing metallized LDS compound traces connected to stud bumps and the capability of achieving enhanced thermal conductivity by adding, e.g., copper heat sinks within the framework of a process exhibiting a high level of flexibility.

One or more embodiments may rely on Laser Direct Structuring (LDS) technology. LDS is a consolidated technology in the semiconductor area with laser activation and plating conventionally used in production for various electronic applications.

BRIEF DESCRIPTION OF THE SEVERAL VIEWS OF THE DRAWINGS

One or more embodiments will now be described, by way of example only, with reference to the annexed figures, wherein.

Figure 1:
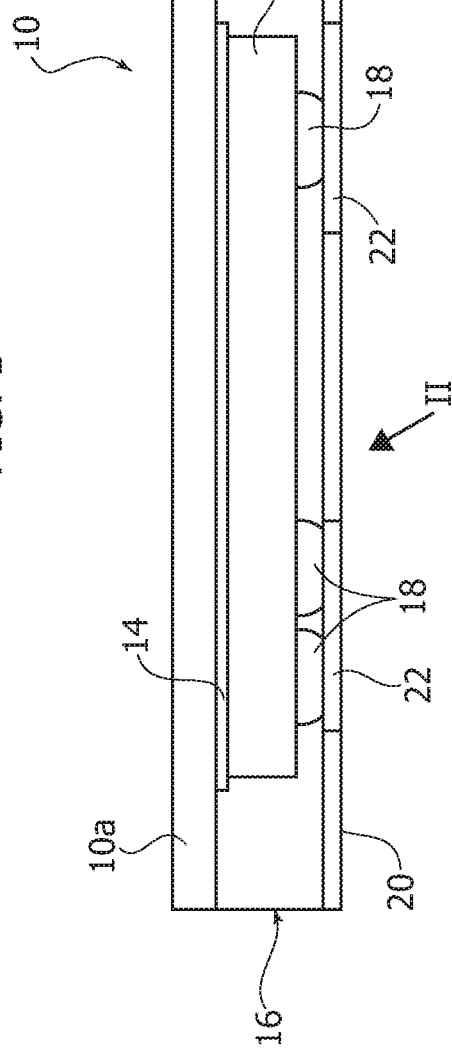
FIG. 1 is a cross-sectional view of a semiconductor device according to embodiments.

It will be appreciated that, for the sake of clarity and ease of understanding, the various views may not be drawn to a same scale.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference 10 indicates a semiconductor product or package including a semiconductor die or chip 12, which, in one or more embodiments, may be attached (e.g., via a die attach layer 14) onto a layer or substrate 10a. The substrate 10a may be any material, and in some embodiments the substrate 10a is tape, paper or metal. A metal substrate may be used to provide thermal dissipation, if desired.

The chip or die 12 may be any of a variety of a semiconductor chips or die as conventional in the art. In at least one embodiment, the chip or die 12 includes an active surface including one or more integrated circuits.

Also, while the discussion herein will be provided for simplicity in connection with semiconductor products including one chip or die 12, those skilled in the art will easily understand that one or more embodiments may include a plurality semiconductor chips or dice 12, such as plurality of stacked dice or dice arranged horizontal to each other.

In FIG. 1, reference 16 denotes encapsulation material such as, e.g., a package molding compound (PMC), such as polymers including a polymer resin, having electrically-insulating properties which can be molded onto the chip or die 12. The molding compound is an LDS (Laser Direct Structuring) molding compound (e.g., a thermoplastic/thermoset polymer). In some embodiments, the LDS molding compound includes conductive additives. After areas of the molding compound are activated by the laser, the activated areas may be plated to form lands or traces. In one embodiment, the activation process removes a coating on the conductive additives in the LDS molding compound to form a conductive area configured to receive the plating layer that forms the lands or traces. During laser activation, the laser may also remove portions of the molding compound to form one or more recesses. The laser may be isolated to particular areas to obtain recesses in the molding compound at differing depths. Furthermore, in some embodiments, the parameters of the laser may be adjusted to obtain recesses of differing depths.

In one or more embodiments, conductive stud bumps 18 (formed in manner known per se) are coupled to bond pads of the chip or die 12 and provide electrical connection with respect to the die or chip 12. As shown in FIG. 1, multiple bumping may possibly be included, e.g., when high power driving capability is desired. In particular, a plurality of conductive stud bumps 18 may be coupled to a single bond pad of the die or chip 12 and coupled to a single land 22.

In one or more embodiments, a secondary molding encapsulation 20 can be provided (this can include, e.g., resist or solder mask material depending on applications), along with electro-plated lands 22. These can be provided on the LDS (Laser Direct Structuring) compound by taking advantage of the fact that an LDS compound (e.g., a thermoplastic/thermoset polymer) can be plated after laser activation.

Figure 2:
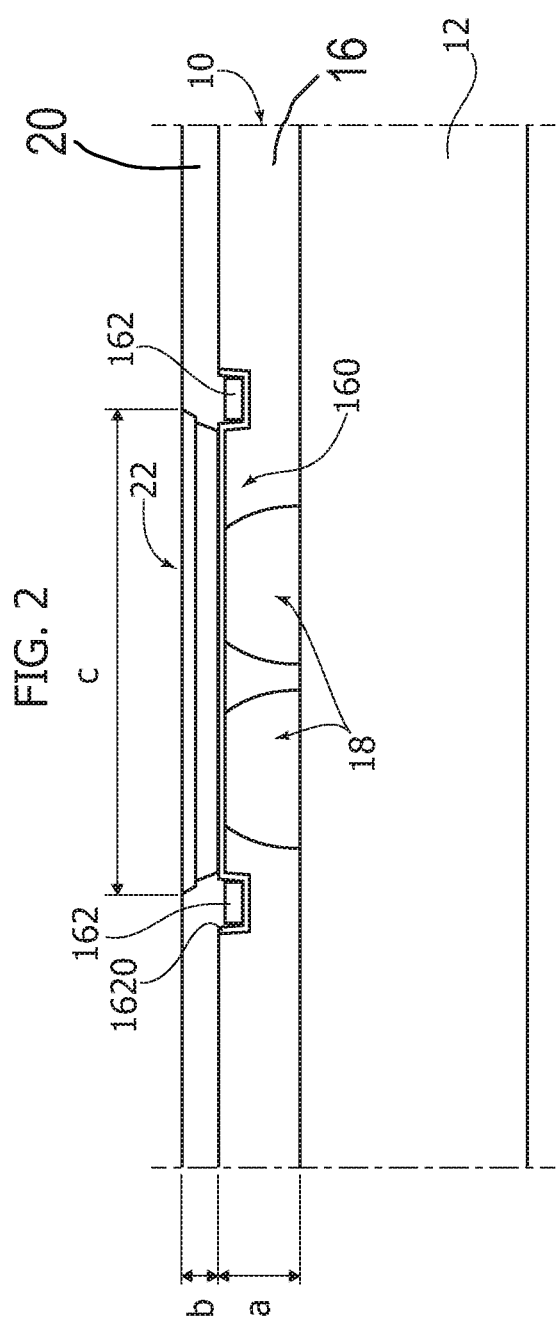
FIGS. 2, 3 and 4 are exemplary of possible details of one or more embodiments.

FIG. 2 is an exemplary view of a portion of FIG. 1 at the location indicated by the arrow II reproduced in an enlarged scale and arranged "upside-down" for further clarity showing an exemplary view of studs bumps 18 after a grinding step (as discussed in the following). FIG. 2 also shows how a laser ablated area 160 of the package 16 may be used (e.g., at a second level of laser ablation) to create a routing of electrically-conductive lines (traces or tracks) 162 over the surface area of the semiconductor product 10.

By way of (non-limiting) reference, the laser ablated area 160 may have a thickness of 50-70 micron (1 micron=$10^{-6}$ m) with a superposed plated land 22 (possibly having an anchoring shape due to deposit growth) having a thickness of, e.g., 25-50 micron (1 micron=$10^{-6}$ m).

Still by way of non-limiting example, the land areas 22 may have a width (extension in the main extension plane of the semiconductor product 10) of 50-400 micron (1 micron=$10^{-6}$ m).

Figure 3:
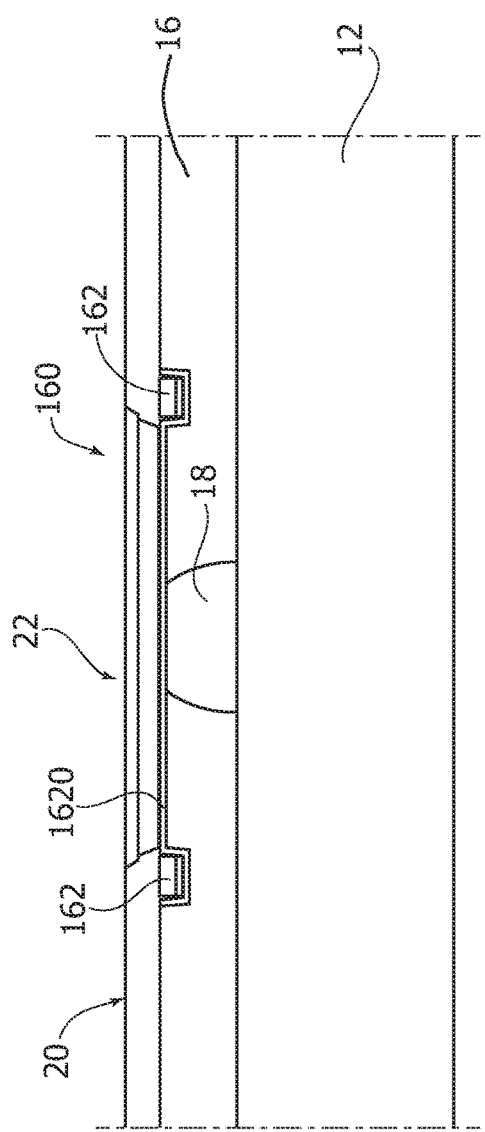

FIG. 3 is another enlarged view of FIG. 1 at a different location than is shown in FIG. 2, and further highlighting the secondary molding encapsulation 20 as obtained, e.g., via a (second) epoxy molding step or applying a solder mask.

Figure 4:
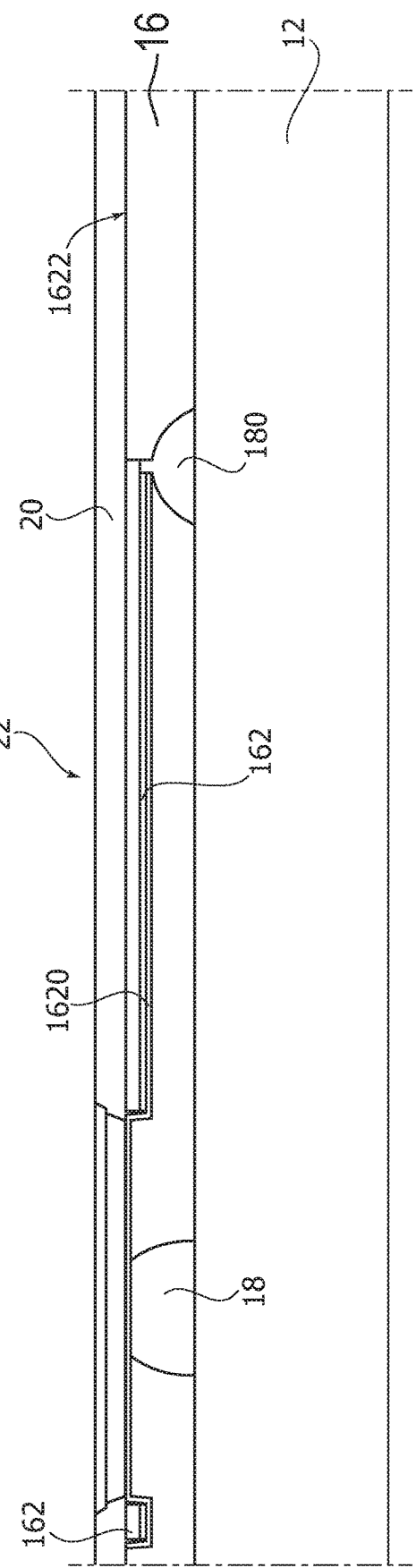

FIG. 4 is cross-section view of the semiconductor product and is exemplary of possible approaches in providing routing as exemplified by a trace 162. For instance, one or more embodiments may provide for the creation of a superficial laser scrubbing layer with the possible provision of small stud bumps 180 (having a thickness or height lower than the stud bumps 18) providing electrical contact with (deep) routing traces 162 at a (first) grinding level (1622) with the secondary molding encapsulation 20 formed thereon.

Figure 5:
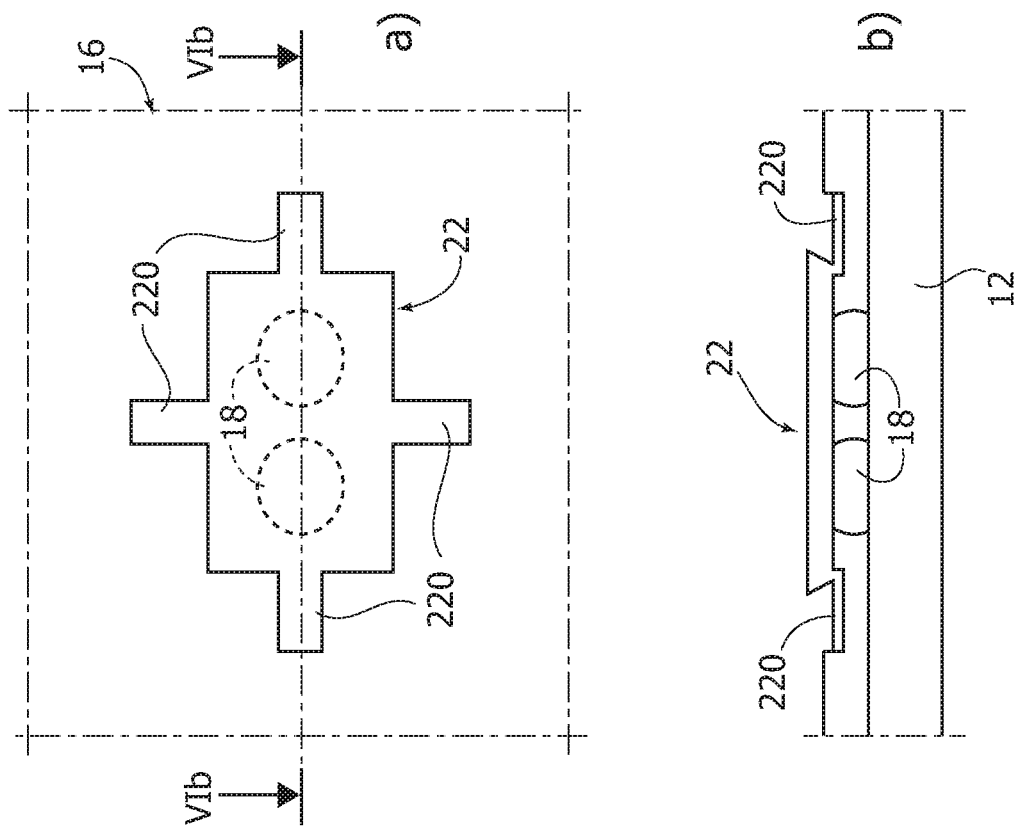
FIGS. 5 to 8 are exemplary of possible details of one or more embodiments, each of these figures including two parts, indicated a), b), respectively; of these, parts b) are cross-sectional views along lines Vb-Vb, VIb-VIb, VIIb-VIIb and VIIIb-VIIIb in part a) of the same figure.
Figure 6:
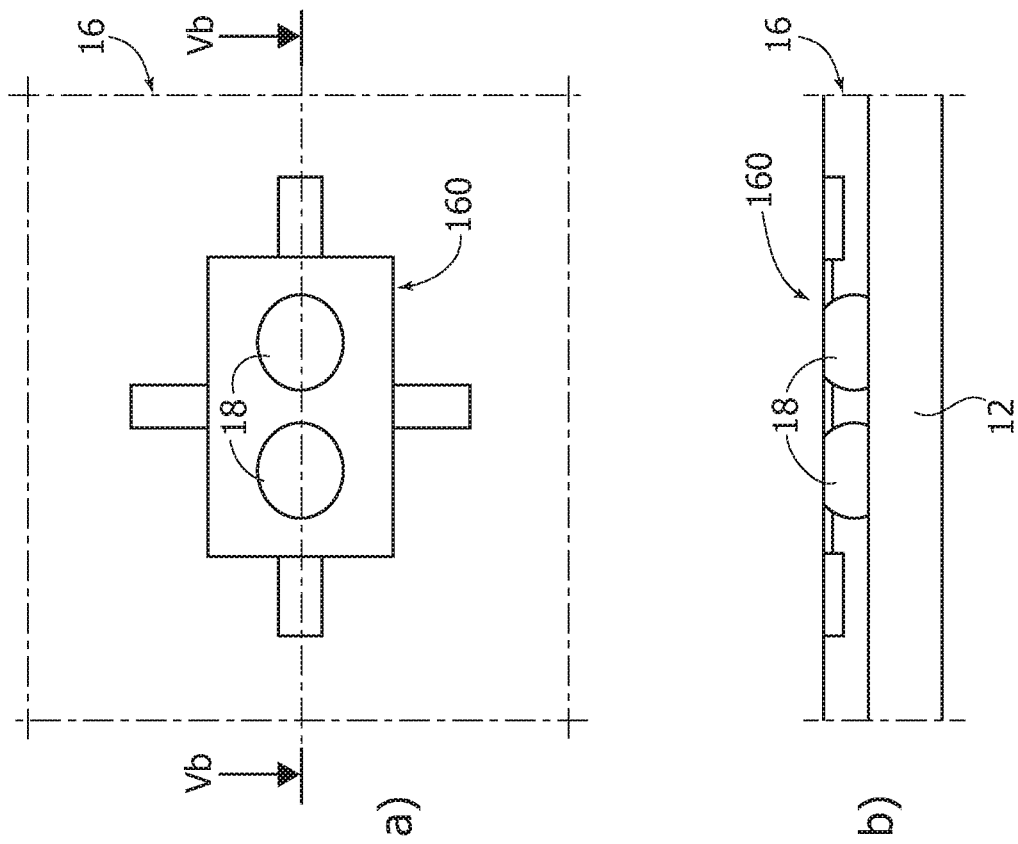
Figure 8:
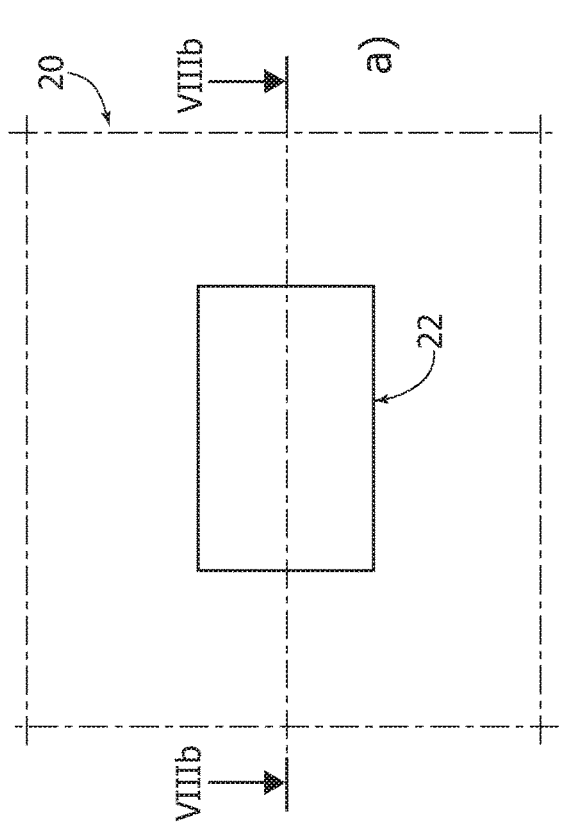
Figure 8:
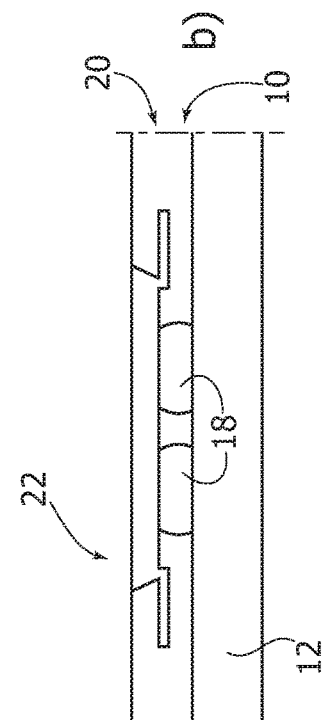
Figure 7:
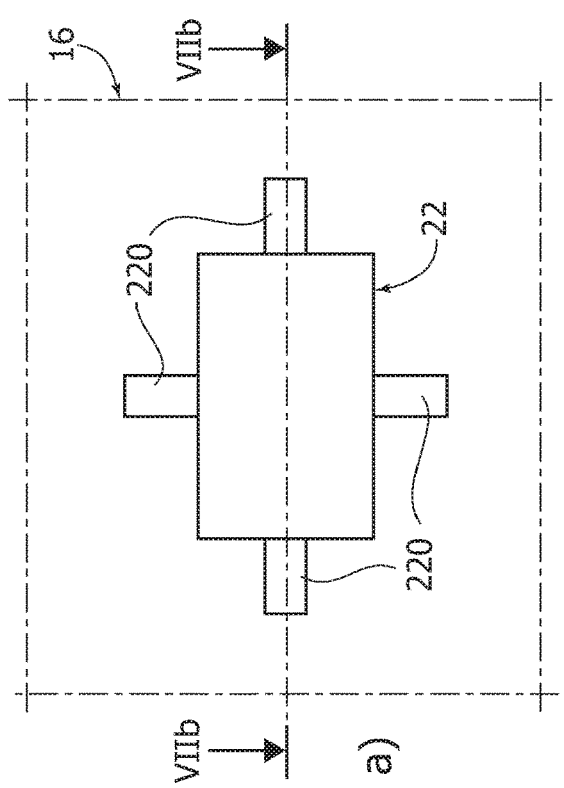
Figure 7:
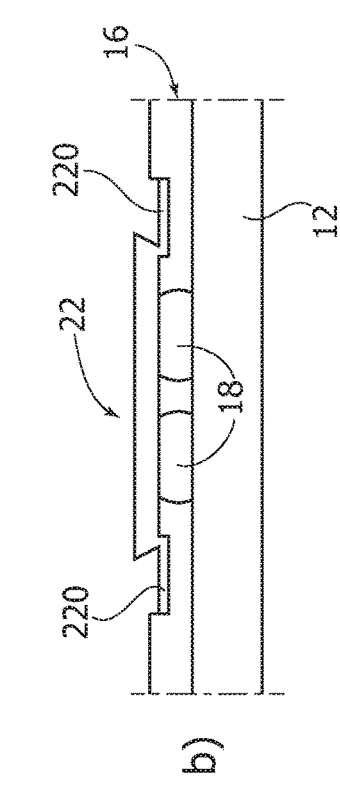

FIGS. 5 and 6 are exemplary of lasering (LDS) processing to produce the laser ablated area 160 around the stud bumps 18 followed by plating including possibly recessed distal portions 220 which, as exemplified by the sequence of FIGS. 7 and 8 may be covered by the second molding step 20.

In one or more embodiments the second molding step may leave the plated areas 22 over the stud bumps 18 exposed to the outer surface of the product package.

In one or more embodiments as shown the electrically-conductive lands 22 may include (e.g., as a result of deposit growth) undercuts providing an anchoring shape for the further molding compound 20.

Figure 9:
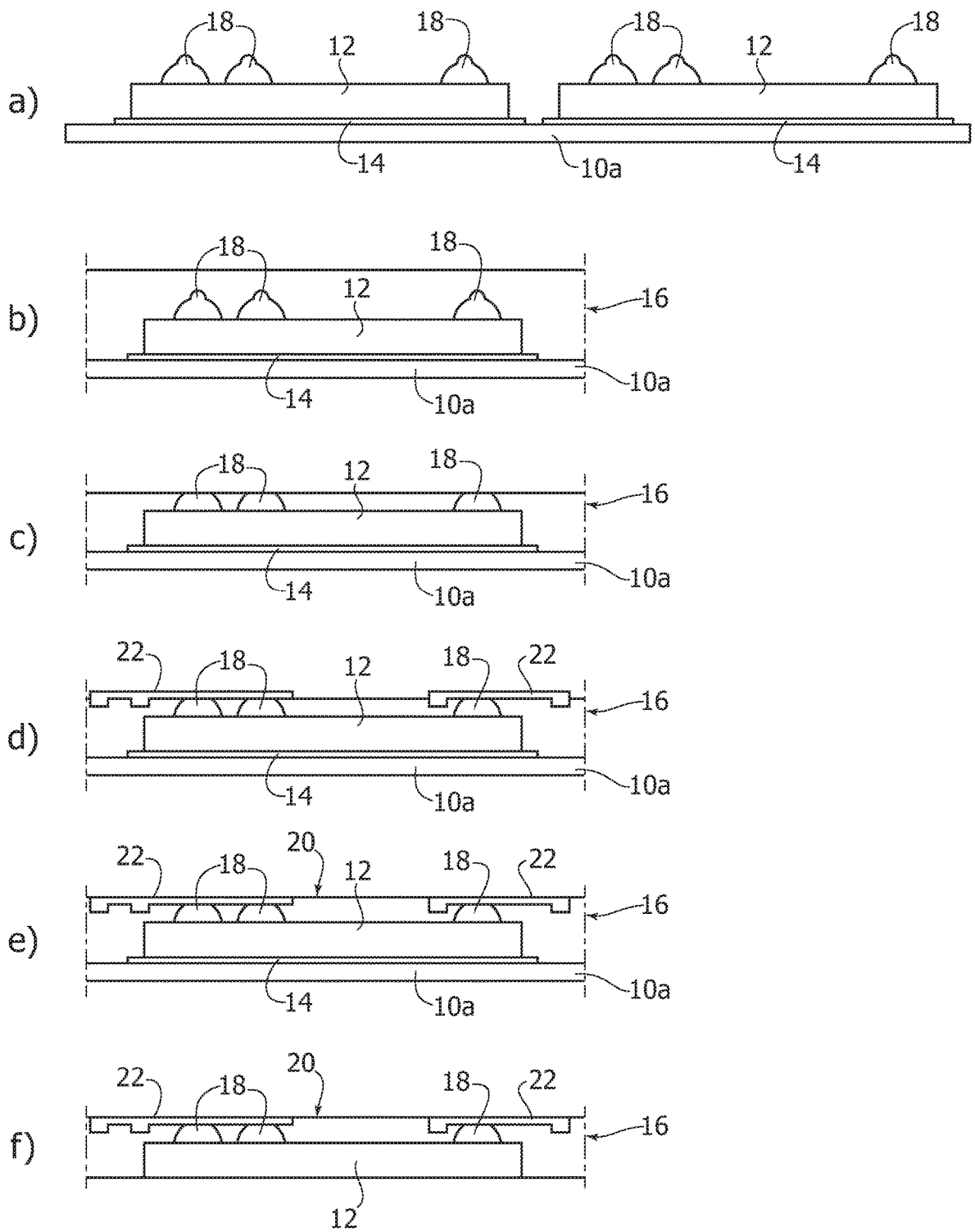
FIG. 9, including six parts indicated a) to f) are exemplary of possible acts in a process according to embodiments.

FIG. 9 summarizes certain steps which may be performed in manufacturing a product as discussed previously.

For instance, part a) of FIG. 9 is exemplary of arranging, onto a "sacrificial" substrate 10*a*, one or more semiconductor chips or dice 12 attached (e.g., at 14) onto the substrate 10*a*) and provided with stud bumps 18.

Part b) of FIG. 9 is exemplary of the provision (e.g., via a conventional film-assisted molding process) of molding material 16 to encapsulate the structure obtained as exemplified at a).

In one or more embodiments, the molding material 16 may include, e.g., an LDS compound.

Part c) of FIG. 9 is exemplary of grinding the surface of the molded mass 16 (e.g., prior to laser activation) in order to expose and flatten the stud bumps 18 to provide a flat "top" surfaces thereof at the surface of the molded mass 16.

Parts d) and e) of FIG. 9 are exemplary of steps associated with laser activation and/or land manufacturing (such as laser scrubbing+plating, as discussed in the foregoing) followed by a (second) molding step to provide the secondary molding encapsulation 20.

The steps exemplified in parts d) and e) may also include forming laser grooves with different depths on the LDS compound 16 in order to create routing traces 162 as exemplified previously.

Part f) of FIG. 9 is exemplary of final removal (e.g., by stripping or grinding) of the sacrificial substrate 10*a*, which may permit singulating individual products 10 when plural chips or dice 12 are arranged onto a common substrate 10*a* as exemplified in part a) of FIG. 9.

One or more embodiments may contemplate applying a flash of gold onto the lands 22.

The basic layout discussed in the foregoing may lend itself to a number of variants.

These may include, e.g., removing the sacrificial substrate 10*a* at an earlier stage than exemplified in FIG. 9.

Figure 10:
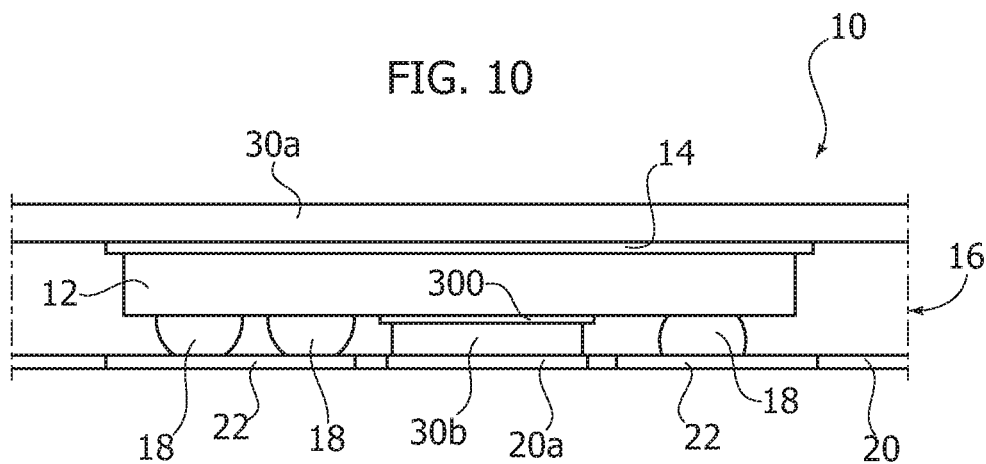
FIGS. 10 to 12 are cross-sectional views exemplary of possible variants of one or more embodiments.

Also FIGS. 10 to 12 (where parts/elements like parts/elements already discussed in connection with the previous figures are indicated with like references, thus making it unnecessary to repeat a detailed description herein) exemplify certain variants which may be applied (individually or in possible combinations) to the basic layout discussed in the foregoing.

For instance, reference 10 is exemplary of the possibility of providing top and bottom heat sink layers 30*a*, 30*b* coupled with the semiconductor die or chip 12 (e.g., at 14 and 300—optionally by using materials having good heat conductivity) with a land 20*a* provided at the bottom heat sink 30*b* to provide heat dissipation.

Providing the top heat sink layer 30*a* may include:
  selecting thermally dissipative material—e.g., metal—for the substrate 10*a*, by leaving such a substrate in place (that is by avoiding removing it as exemplified in part f) of FIG. 9),
  removing the substrate 10*a* as exemplified in part f) of FIG. 9) and substituting therefor (e.g., via growth or lamination/gluing) a heat dissipative layer 30*a*.

Figure 11:
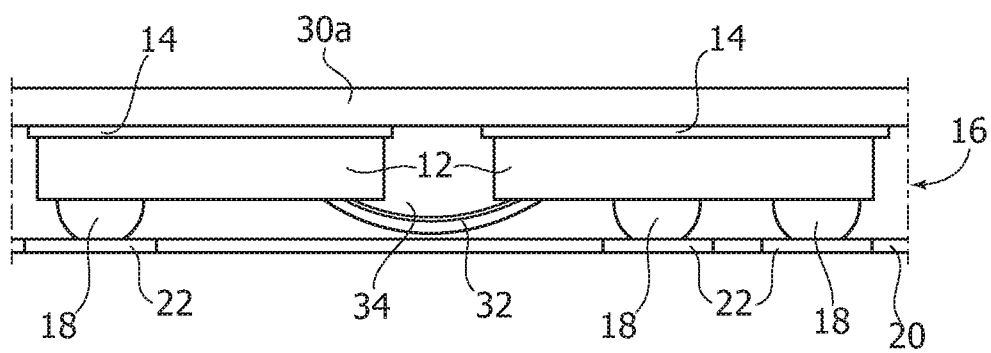

FIG. 11 is exemplary of the possibility of coupling plural semiconductor chips or dice 12 (e.g., via a common heat sink layer 30*a*) in a circuit with wire bonding 32 providing electrical connection between the semiconductor chips or dice. In one or more embodiments a potting mass 34 may be provided to protect such wires 32.

Figure 12:
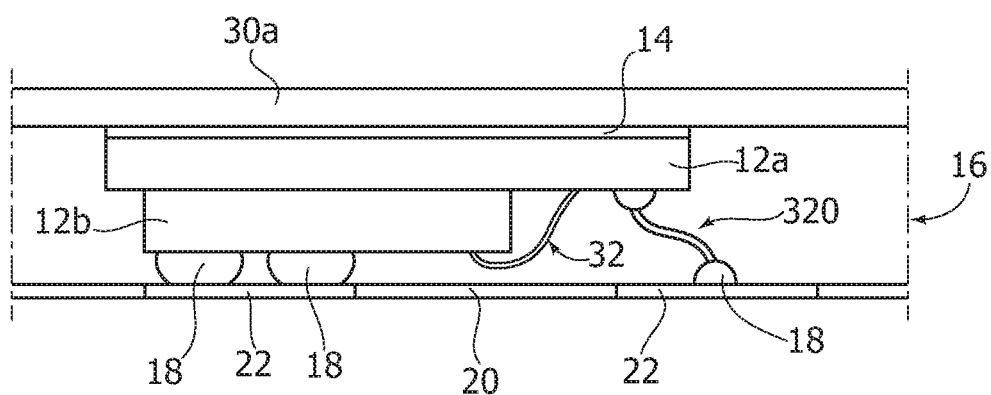

FIG. 12 is exemplary of the possible recourse to a stacked semiconductor die or chip arrangement including plural stacked chips or dice 12*a*, 12*b* possibly coupled via wire bonding 32.

One or more embodiments may adopt a separation of lands 22 (and the associated stud bumps 18) with "power" stud bumps 18/lands 22 used for power supply and "signal" stud bumps 18/lands 22 facilitating signal transfer with respect to the chip or die arrangement as exemplified at 320 on the right-hand side of FIG. 12. Such a possible separation is discussed in detail in a co-pending application filed on even date by the same Applicant.

Figure 13A:
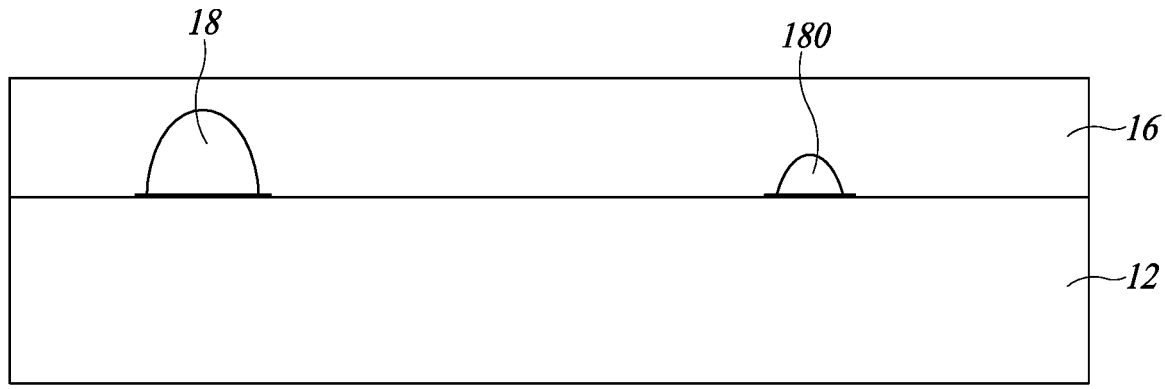
FIGS. 13A to 13C illustrate cross-sectional views of a portion of a semiconductor device, such as the semiconductor device of FIG. 4, at various stages of manufacture according to one embodiment.
Figure 13B:
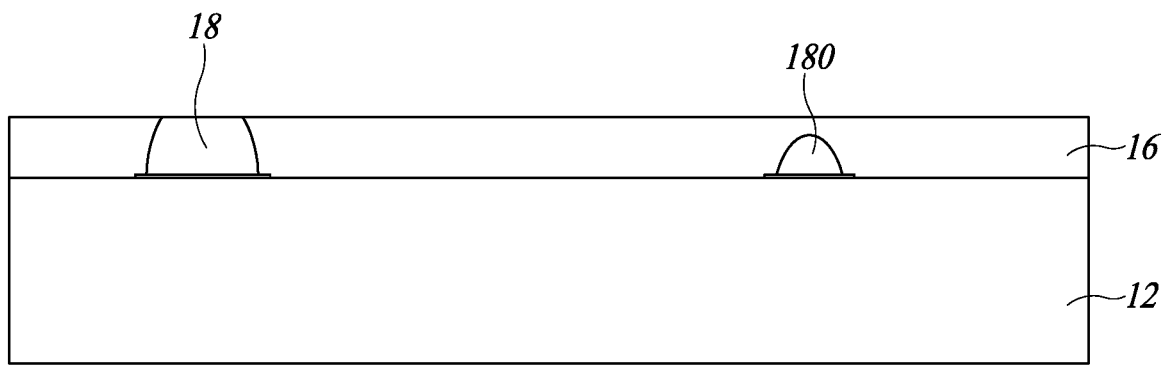
Figure 13C:
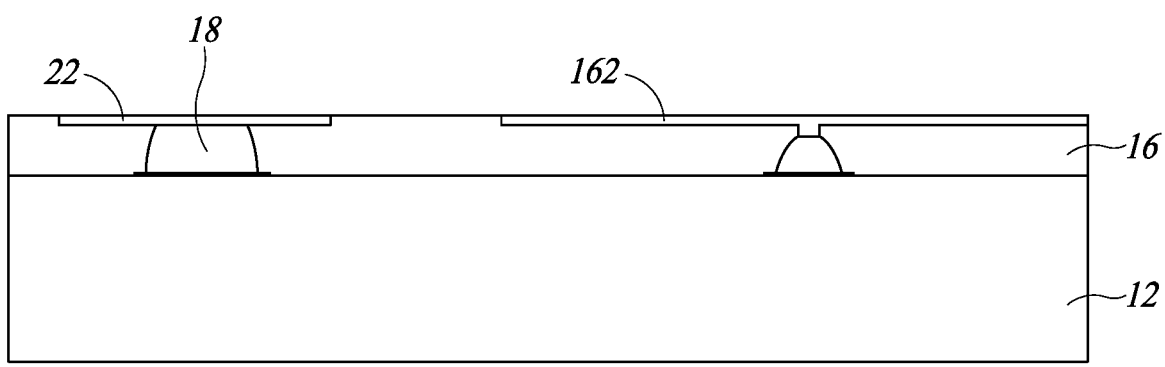

FIGS. 13A to 13C illustrate method steps in accordance with one embodiment for forming a semiconductor device, such as the semiconductor device of FIG. 4. In particular, FIG. 13A shows a portion of the semiconductor die 12. A first conductive stud bump 18 is on a first bond pad of the semiconductor die and a second, smaller conductive stud bump 180 is on a second bond pad of the semiconductor die. A first layer of LDS molding compound or encapsulation 16 is formed over the first conductive stud bump 18 and the second, smaller conductive stud bump 180.

As shown in FIG. 13B, a thickness of the first layer of LDS molding encapsulation 16 is reduced so that a surface of the first conductive stud bump 18 is exposed, such as by a grinding process. A surface of the first layer of LDS molding encapsulation 16 is coplanar with the first conductive stud bump 18. Portions of the first layer of LDS molding encapsulation 16 is laser activated to form a first recess at the first conductive stud bump 18 and a second recess to expose the second, smaller conductive stud bump 180. To form an opening that exposes the second stud bump 180, the laser may be isolated in that area. Furthermore, different parameters of the laser may be used to form the opening that exposes the second stud bump 180. As shown in FIG. 13C, a plating layer is formed on the laser ablating area 160. The plating layer in the second recess forms a trace 162 and the plating layer in the first recess forms a land 22.

Figure 14A:
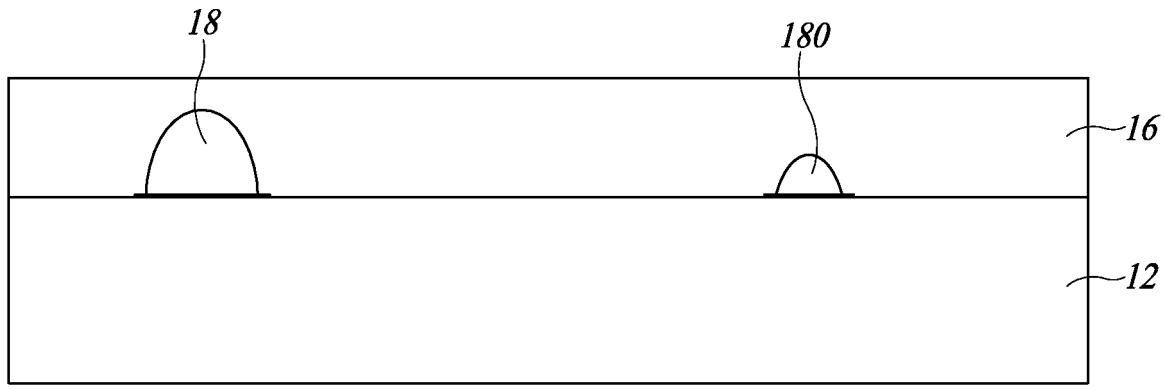
FIGS. 14A to 14G illustrate cross-sectional views of a portion of a semiconductor device, such as the semiconductor device of FIG. 4, at various stages of manufacture according to another embodiment.
Figure 14B:
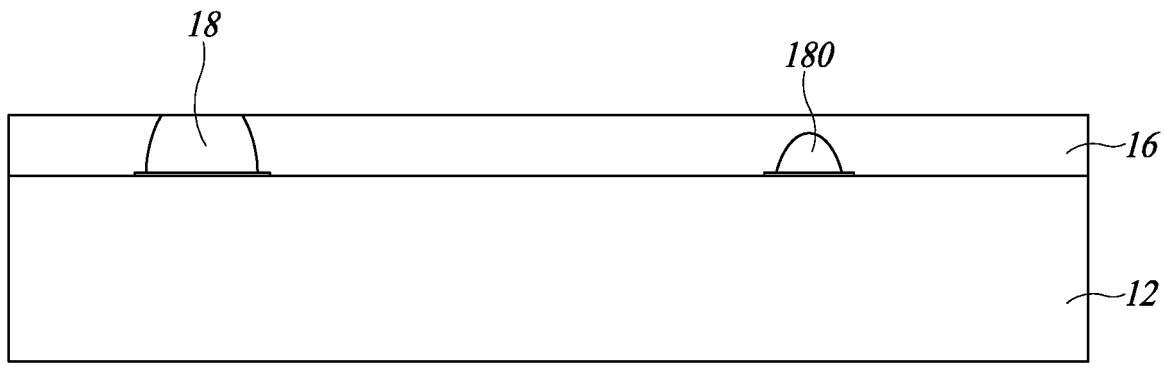
Figure 14C:
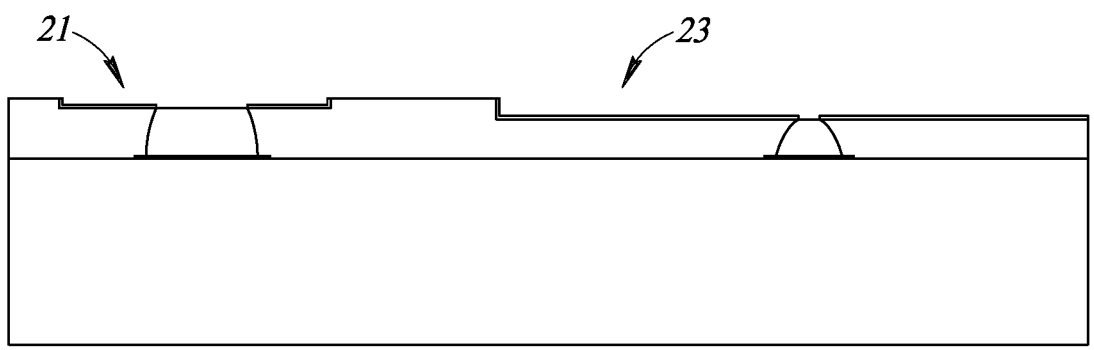
Figure 14D:
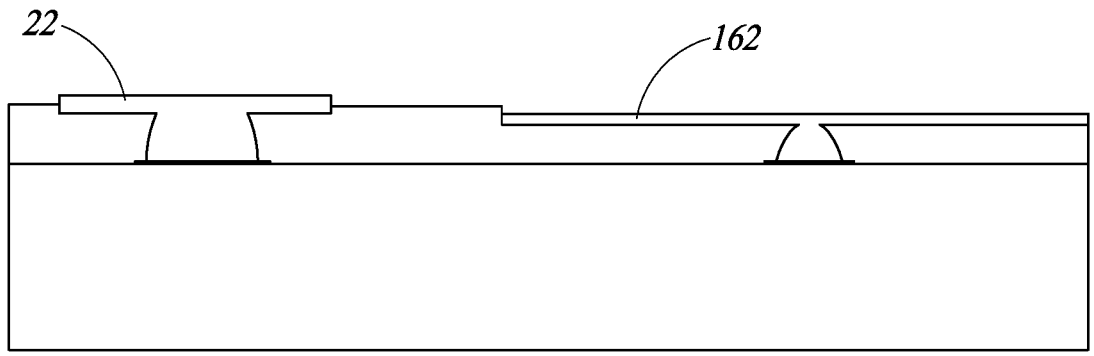

FIGS. 14A to 14G illustrate method steps in accordance with another embodiment for forming a semiconductor device, such as the semiconductor device of FIG. 4. Method steps shown in FIGS. 14A and 14B are the same as the method steps of FIGS. 13A and 13B. In FIG. 14C, however, portions of the first layer of LDS molding encapsulation 16 is laser activated to form recesses of differing depths. In particular, a first laser ablated area of the molding encapsulation forms a first recess 21 at the first conductive stud bump 18 and a second laser ablated area forms a second recess 23 that exposes the second, smaller conductive stud bump 180. The second recess 23 has a greater depth than the first recess 21. Furthermore, the second recess 23 includes an opening at the second, smaller conductive stud bump 180, exposing an upper surface thereof. As mentioned above, the parameters of the laser ablation step, including time exposed to the laser, may be varied to form the different recess depths. The laser ablated areas of the first and second recesses 21, 23 are plated to form a land 22 and a trace 162, respectively, as shown in FIG. 14D.

Figure 14E:
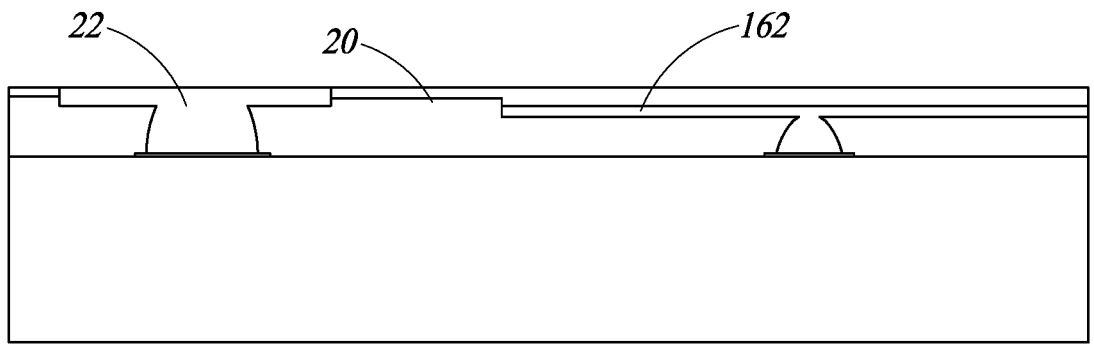
Figure 14F:
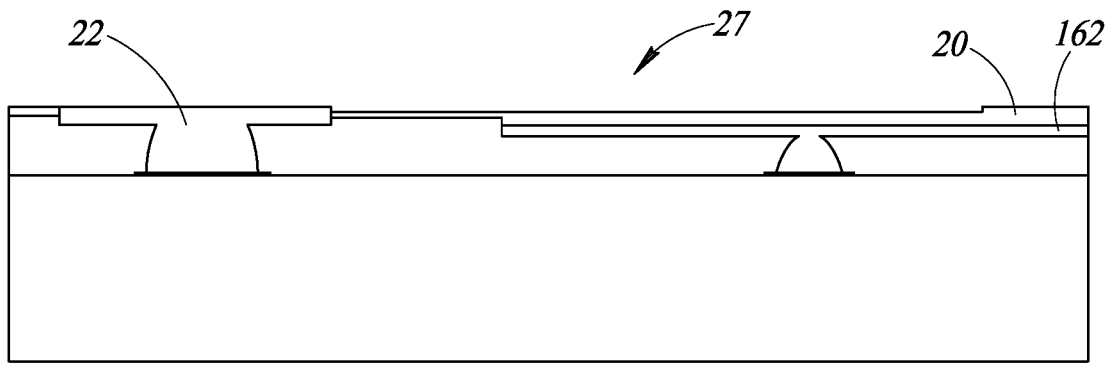
Figure 14G:
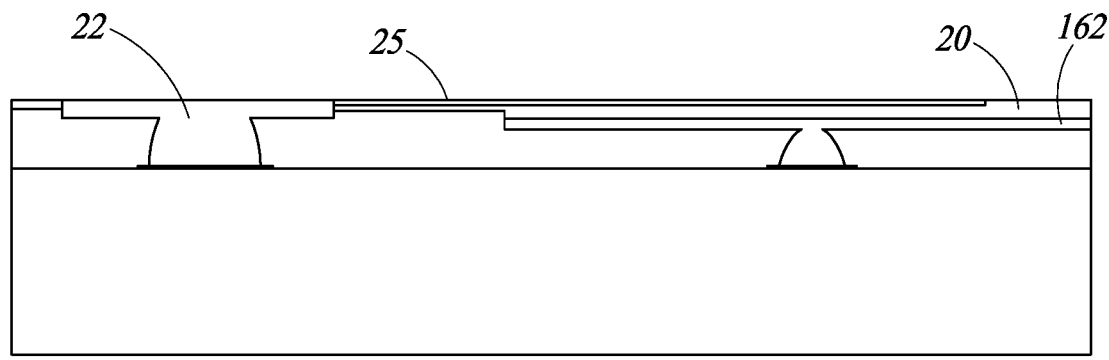

As shown in FIG. 14E, a second layer of molding encapsulation 20 is formed over the trace 162. The second layer of molding encapsulation 20 is an LDS molding encapsulation and may be the same type of molding encapsulation as the first layer of LDS molding encapsulation. A surface of the second layer of molding encapsulation 20 of is coplanar with a surface of the land 22. As shown in FIG. 14F portions of the second layer of molding encapsulation 20 is laser ablated to form one or more a third recess 27. As shown in FIG. 14G, the additional laser ablated area in the recess is plated to form a contact or trace 25 that is coupled to land 22. The process may continue in which one or more further layers of molding encapsulation may be formed, along with laser activation and plating steps. Lands of the semiconductor device are configured to couple the semiconductor device to another component or device.

Figure 15:
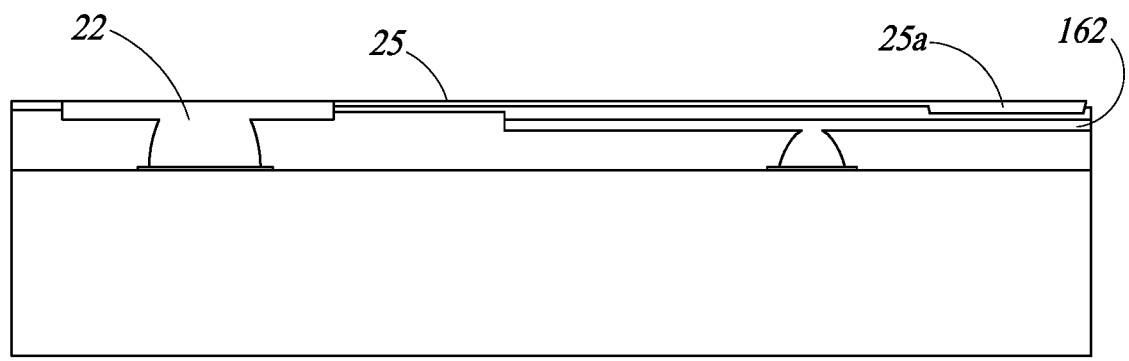
FIG. 15 illustrates a cross-sectional view of a semiconductor device according to another embodiment.

FIG. 15 illustrates a cross-sectional view of a semiconductor device according to another embodiment. In the semiconductor device of FIG. 15, portions of the second layer of LDS molding encapsulation 16 is laser ablated to expose a portion of the trace 162. Thus, when plating the trace 25, the trace 25a makes contact with the trace 162 as shown in FIG. 15. Thus, the trace 25 and trace 162 are electrically coupled together.

Figure 16:
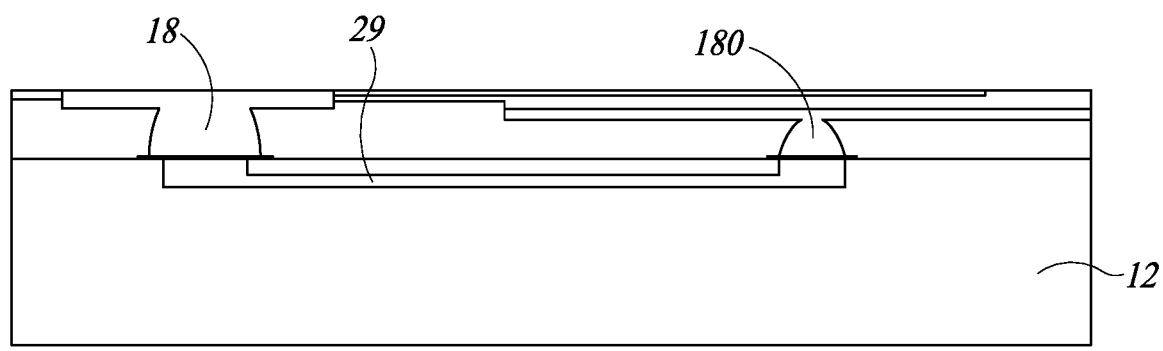
FIG. 16 illustrates a cross-sectional view of a semiconductor device according to another embodiment.

FIG. 16 illustrates a cross-sectional view of a semiconductor device according to another embodiment. The semiconductor device includes a trace 29 formed on the semiconductor die 12 prior to a molding process. Trace 29 electrically couples the first conductive stud bump 18 to the second, smaller conductive stud bump 180.

It is to be appreciated that one or more embodiments provide additional routing capability of the semiconductor devices. Stud bumps of different height allow for redistribution of the conductive pads of the semiconductor die. Thus, by stacking the molding encapsulation and the traces, electrical connection to the stud bumps conductive pads of the semiconductor die may be redistributed through the molding encapsulation. Thus, by using laser scrubbing or laser structuring to form recesses in the LDS molding encapsulation and adding a plating layer, laser drilled through mold vias (TMV) over bond pads of a die may be avoided. This is beneficial because forming through mold vias can be difficult to form with a laser, particularly when the bond pads are formed with a top layer of aluminum, due to the high reflectance. It will otherwise be appreciated that features/elements exemplified in any one of the figures can be applied (singly or in combination) to embodiments exemplified in any other figure, the embodiments herein having a common feature in that a conventional substrate/lead frame arrangement can be dispensed with.

A method according to one or more embodiments may include:
providing an assembly including at least one semiconductor die (or chip—e.g., 12) attached (e.g., 14) on a substrate (e.g., 10a), the semiconductor die provided with electrically-conductive stud bumps (e.g., 18) opposite the substrate, the stud bumps embedded in a molding compound (e.g., 16) molded thereon,
leveling the molding compound to expose the distal ends of the stud bumps at a surface of the molding compound,
forming:
i) recessed electrically-conductive lines (e.g., 162) extending over said surface of the molding compound,
ii) electrically-conductive lands (e.g., 22) over the distal ends of the stud bumps,
providing a further molding compound (e.g., 20) covering the recessed electrically-conductive lines and surrounding the electrically-conductive lands.

One or more embodiments may include removing said substrate, optionally after said leveling, forming and providing said further molding compound.

In one or more embodiments the substrate may include material selected from tape (e.g., organic) material, paper material and metallic material.

In one or more embodiments, leveling the molding compound to expose the distal ends of the stud bumps may include applying grinding to said surface of the molding compound.

In one or more embodiments the molding compound may include laser-activatable direct structuring compound (LDS), optionally including thermoplastic and/or thermoset polymer.

In one or more embodiments, forming the recessed electrically-conductive lines may include applying laser ablation (e.g., 1620) to said surface of the molding compound.

In one or more embodiments, forming the recessed electrically-conductive lines may includes laser activation of the molding compound (16).

In one or more embodiments, secondary stud bumps (e.g., 180) can be electrically coupled with the recessed electrically-conductive lines.

In one or more embodiments, said electrically-conductive lands with undercuts may provide an anchoring shape for the further molding compound.

In one or more embodiments, the further molding compound (e.g., 20) may include resist material or solder mask material.

One or more embodiments may include providing a heat-sink layer over the semiconductor die opposite the stud bumps.

One or more embodiments include providing a thermally-conductive pad (e.g., 20a) at said surface of the molding compound by providing a heat-dissipation path (e.g., 30b) between the semiconductor die and said surface of the molding compound.

One or more embodiments may include providing said assembly with a plurality of semiconductor dice attached to said substrate.

In one or more embodiments may include providing electrical lines (e.g., 32) between the semiconductor dice in said plurality of semiconductor dice, with said electrical lines embedded in a potting mass.

In one or more embodiments a semiconductor device (e.g., 10) may include:
at least one semiconductor die provided with electrically-conductive stud bumps embedded in a molding compound molded thereon, wherein the stud bumps include distal ends at a surface of the molding compound,
recessed electrically-conductive lines extending over said surface of the molding compound,
electrically-conductive lands over the distal ends of the stud bumps,
a further molding compound covering the recessed electrically-conductive lines and surrounding the electrically-conductive lands, the semiconductor device optionally produced with the method of one or more embodiments.

One or more embodiments may include at least one semiconductor device according to one or more embodiments, e.g., arranged on a common substrate 30a.

Without prejudice to the underlying principles, the details and embodiments may vary, even significantly, with respect to what has been described, by way of example only, without departing from the extent of protection.

The various embodiments described above can be combined to provide further embodiments. These and other changes can be made to the embodiments in light of the above-detailed description. In general, in the following claims, the terms used should be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising:
a semiconductor die;
a first stud bump coupled to the semiconductor die; and
a first layer of molding compound on the semiconductor die and along side surfaces of the first stud bump, wherein the first stud bump includes a distal end at a surface of the first layer of molding compound, wherein the first layer of molding compound is a laser-activatable direct structure molding compound, wherein a first portion and a second portion of the surface of the first layer of molding compound have been laser activated to form first and second laser activated areas, respectively, wherein the first laser activated area is proximate the distal end of the stud bump, wherein the first laser activated area forms a first recess in the surface of the first layer of molding compound and the second laser activated area forms a second recess in the surface of the first layer of molding compound, wherein the second recess has a depth that is greater than a depth of the first recess;
an electrically-conductive line on the second laser activated area;
an electrically-conductive land on the first laser activated area; and
a second layer of molding compound covering the first electrically-conductive line and along side surfaces of the electrically-conductive land.

2. The semiconductor package of claim 1, further comprising a second stud bump, the electrically-conductive line being electrically coupled to the second stud bump.

3. The semiconductor package of claim 1, wherein the laser-activatable direct structuring molding compound is thermoplastic with conductive additives or thermoset polymer with conductive additives.

4. The semiconductor package of claim 1, wherein the first layer of molding compound is a same material as the second layer of molding compound.

5. A device, comprising:
a package including:
a semiconductor die;
a stud bump coupled to the semiconductor die;
a first layer of molding compound on a surface of the die and along a side surface of the stud bump, wherein the first layer of molding compound is a laser-activatable direct structure compound, wherein portions of the laser-activatable direct structure compound has been actuated to form first and second activated areas, the first activated area forming a first recess in the first layer of molding compound at a distal end of the stud bump, the second activated area forming a second recess in the first layer of molding compound, the second recess having a depth that is greater than a depth of the first recess; and
a conductive material in the first recess and electrically coupled to the first activated area and the stud bump.

6. The device of claim 5, wherein the conductive material forms a land that couples the package to another device or component.

7. The device of claim 6, wherein the land is coupled to a printed circuit board by a conductive ball.

8. The device of claim 5, wherein the stud bump is a first stud bump, the package including a second stud bump that is electrically coupled to the second activated area.

9. The device of claim 8, further comprising a second layer of molding compound covering the conductive material in the first recess, the second recess, or both to form a trace.

10. The device of claim 9, wherein the second stud bump has a height that is less than a height of the first stud bump.

11. A semiconductor package, comprising:
a semiconductor die;
a plurality of stud bumps coupled to the semiconductor die;
a first layer of molding compound on a surface of the die and along side surfaces of the plurality of stud bumps, wherein the first layer of molding compound is a laser-activatable direct structure compound;
a plurality of laser activated areas on the first layer of molding compound wherein the plurality of laser activated areas form respective recesses in the first layer of molding compound at respective ones of the plurality of stud bumps, wherein at least one of the plurality of recesses has a depth that is greater than a depth of the remaining plurality of recesses; and
conductive material on the plurality of laser activated areas.

12. The semiconductor package of claim 11, wherein the conductive material is a plating layer.

13. The semiconductor package of claim 11, wherein the plurality of laser activated areas and the conductive material are electrically coupled to the plurality of stud bumps, respectively.

14. The semiconductor package of claim 13, wherein the plurality of stud bumps are two stud bumps.

15. The semiconductor package of claim 11, wherein the conductive material is on a center portion of each of the plurality of laser activated areas.

16. The semiconductor package of claim 15, further comprising a second layer of molding compound on a perimeter of the plurality of laser activated areas.

17. The semiconductor package of claim 11, wherein the conductive material on the respective plurality of laser activated areas form lands of the semiconductor package.

* * * * *

UNITED STATES PATENT AND TRADEMARK OFFICE
CERTIFICATE OF CORRECTION

PATENT NO. : 10,861,760 B2  
APPLICATION NO. : 16/551272  
DATED : December 8, 2020  
INVENTOR(S) : Federico Giovanni Ziglioli Page 1 of 1

It is certified that error appears in the above-identified patent and that said Letters Patent is hereby corrected as shown below:

In the Claims

Column 10, Line 31, Claim 11:
"compound wherein" should read, --compound, wherein--.

Signed and Sealed this
Second Day of February, 2021

Drew Hirshfeld
*Performing the Functions and Duties of the*
*Under Secretary of Commerce for Intellectual Property and*
*Director of the United States Patent and Trademark Office*